United States Patent
Woodbury et al.

(10) Patent No.: US 6,403,472 B1
(45) Date of Patent: Jun. 11, 2002

(54) METHOD OF FORMING RESISTIVE CONTACTS ON INTERGRATED CIRCUITS WITH MOBILITY SPOILING IONS INCLUDING HIGH RESISTIVE CONTACTS AND LOW RESISTIVITY SILICIDE CONTACTS

(75) Inventors: Dustin A. Woodbury, Indian Harbour Beach; Joseph A. Czagas, Palm Bay, both of FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/339,274

(22) Filed: Jun. 23, 1999

(51) Int. Cl.[7] ................ H01L 21/4763; H01L 21/44
(52) U.S. Cl. ................ 438/642; 438/643; 438/651; 438/653
(58) Field of Search ................ 438/382, 303, 438/528, 618, 682, 683, 286, 597, 622, 621, 624, 635, 598, 642, 643, 649, 651, 656, 693

(56) References Cited

U.S. PATENT DOCUMENTS

| | | | |
|---|---|---|---|
| 4,700,465 A | * 10/1987 | Sirkin | 437/20 |
| 5,635,746 A | 6/1997 | Kimura et al. | |
| 6,051,494 A | * 4/2000 | Iwamatsu et al. | 438/683 |
| 6,146,934 A | * 11/2000 | Gardner et al. | 438/230 |

FOREIGN PATENT DOCUMENTS

| | | |
|---|---|---|
| EP | 56060030 | 5/1981 |
| EP | 56147431 | 11/1981 |
| EP | 61061451 | 3/1986 |
| EP | 06177145 | 6/1994 |
| JP | 56-147431 | 11/1981 |
| JP | 61-61451 | 3/1986 |
| JP | 6-177145 | 6/1994 |

OTHER PUBLICATIONS

Wolf, "Silicon Processing for the VLSI Era—vol. 2 Process Integration", Lattice Press, 1990, p. 128.*
Wolf, "Silicon Processing for the VLSI Era; vol. 2—Process Integration", Lattice Press, 1990, p. 132.*
European Search Report.

* cited by examiner

*Primary Examiner*—Trung Dang
*Assistant Examiner*—William M. Brewster
(74) *Attorney, Agent, or Firm*—Fogg, Slifer, Polglaze, Leffert & Jay, PA

(57) ABSTRACT

A semiconductor device or integrated circuit has high and low resistive contacts. Mobility spoiling species such as carbon or oxygen are implanted into all contacts. The high resistive contacts are covered with a barrier metal to protect silicide from chemical interaction with the interconnect metalization (aluminum) in the low-resistance contacts. Selective silicide formation converts some of the contacts back to low-resistance contacts.

6 Claims, 2 Drawing Sheets

METHOD OF FORMING RESISTIVE CONTACTS ON INTERGRATED CIRCUITS WITH MOBILITY SPOILING IONS INCLUDING HIGH RESISTIVE CONTACTS AND LOW RESISTIVITY SILICIDE CONTACTS

BACKGROUND OF INVENTION

This invention relates to the insertion of resistors in integrated-circuit memory or logic, specifically as related to semiconductor contacts.

DISCUSSION OF PRIOR ART

Resistors of high value (starting at 1 k ohm) are often desired at many locations in a circuit. A typical application is the use of resistors in memory or logic to guard against single event upset phenomena in spacecraft and other applications. Typically such resistors are patterned from a high sheet resistance film. It would be advantageous to integrate a high value resistor into a semiconductor contact, thus avoiding the area penalty for using such resistors repetitively over the surface of the circuit.

Chen et al. (U.S. Pat. No. 5,665,629) explains the formation of a highly-resistive layer over contact openings using a CVD or physical deposition process, controlling the resistivity of the layer through control of the proportion of silicon in the deposition process, and subsequently performing a pattern mask and etch of the deposited material to remove selectively the deposited resistive layer.

Manning (U.S. Pat. Nos. 5,159,430 and 5,232,865) explains the formation of polysilicon-filled vias in contact with a silicon device and subsequently implanting oxygen or nitrogen to increase the resistance of the polysilicon plus. A high-temperature anneal at about 950° C. is carried out to stabilize the resistor value. Since load resistors are required only in some of the contacts, Manning's process involves fabricating the resistor contacts in a separate step, (i.e., two mask steps are required in order to fabricate all the contacts). An annealing temperature of 950° C. is high for very shallow doped devices, which can cause dopant spreading and affect junction widths. It is therefore preferable to form a high-value resistor using a lower-temperature process.

These prior-art methods explain the formation of a high-value resistor by either introducing silicon in an $SiO_2$ layer or introducing oxygen or nitrogen into an Si layer, (i.e., by forming off-stoichiometric structures).

OBJECTIVES, AND ADVANTAGES

The invention simplifies the prior art by converting desired silicon substrate material in a contact to a material with a desired higher resistivity, thereby eliminating the need to incorporate an added resistive layer.

DETAILED DESCRIPTION OF THE DRAWINGS

SUMMARY

The invention implants a mobility spoiling species such as carbon or oxygen directly in the open contact after the contact has been cut. The subsequent steps selectively remove the mobility spoiling material from the substrate, thereby creating the desired low resistance contacts, and leaving the high-resistance contacts in place, with no added resistive layer. The use of precision implant techniques obviates the need for high-temperature annealing.

DETAILED DESCRIPTION OF THE INVENTION

Figure 1A:
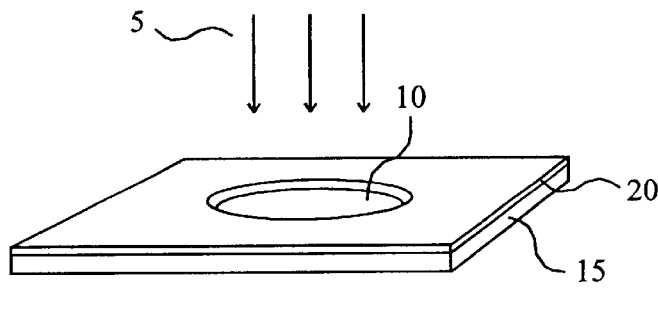
FIG. 1A shows an oblique view of a contact at the time of implant of the mobility spoiling material.
Figure 1B:
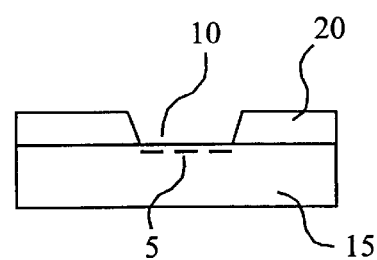
FIG. 1B shows a cross section of a contact after implant.

Refer to FIG. 1. A contact 10 is cut through a field dielectric 20 to expose a silicon substrate 15. A mobility spoiling ion species 5 is implanted through contact 10 in substrate 15, for all contacts 10 on substrate 15.

Figure 2:
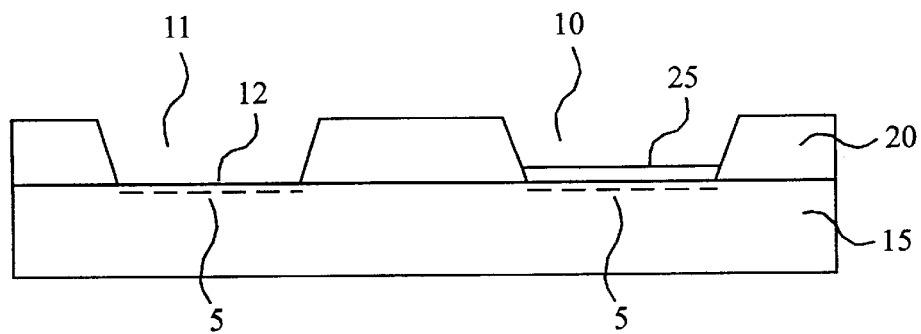
FIG. 2 shows the results of the selective etch (left contact) after the contact oxidation.

Refer to FIG. 2. An oxide 25 is grown or deposited on all contacts 10, 11. Selective etching then removes oxide 25 from some contacts 11 leaving exposed surface 12 containing implanted ion species 5. In the preferred embodiment of the invention, a deposited oxide 25 is used, since a grown oxide is not efficient at removing implanted carbon but may consume implanted oxygen. The effect of this selective deposition is to differentiate high resistance contacts from low resistance contacts.

Figure 3:
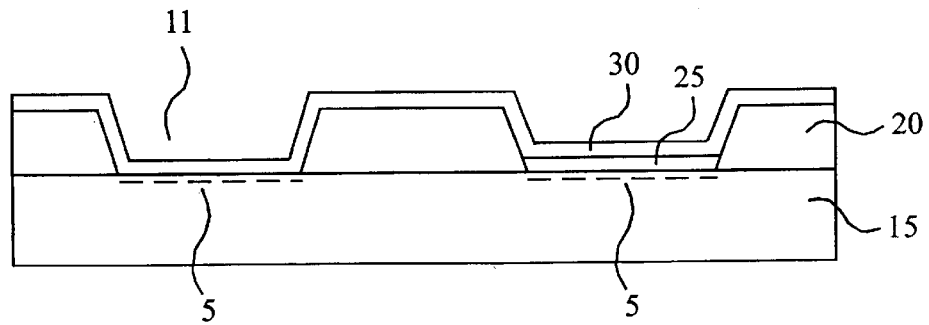
FIG. 3 shows the results after the deposition of a nonselective siliciding material.
Figure 4:
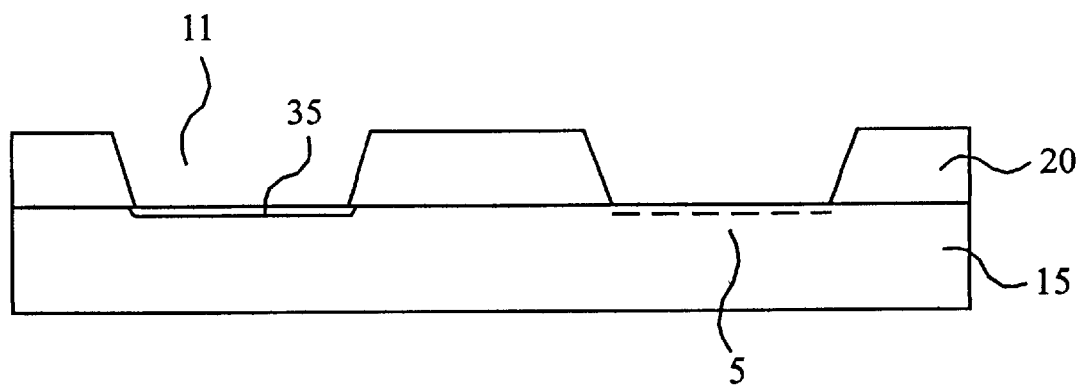
FIG. 4 shows the results after the stripping of the residual non-silicided metal and the contact oxide.

Refer to FIG. 3. A nonselective siliciding metal 30 is then deposited and sintered to form a silicide in selected low resistance contacts 11, and then metal 30 and oxide 25 are both stripped away. Referring to FIG. 4, left contact 11 now contains silicide, making contact 11 a low resistance contact as desired. The right contact includes the mobility spading species and has a higher resistance than the left contact.

Figure 5:
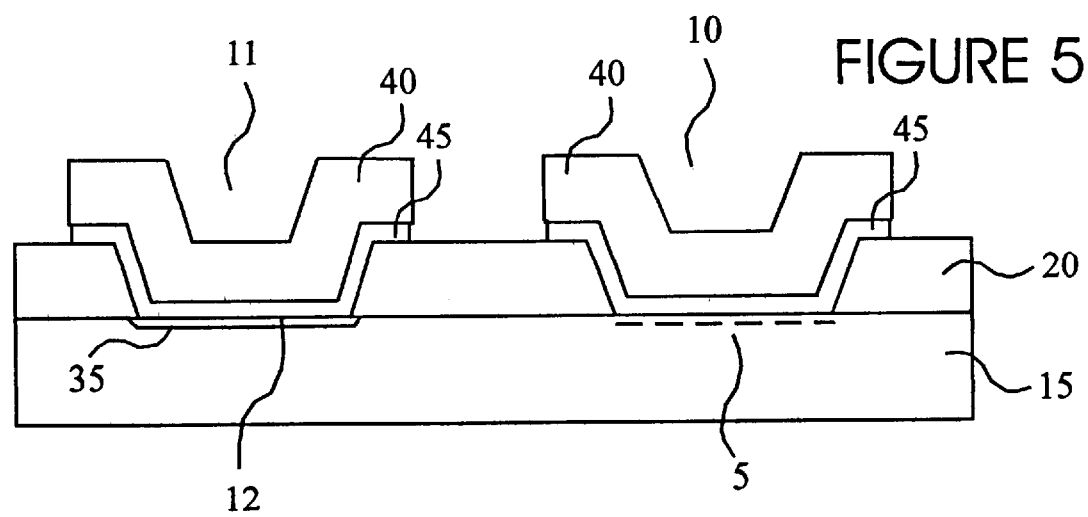
FIG. 5 shows the final metalization, with an interconnect metal in place on a barrier metal such as TiW which protects the contact from chemical interaction with the interconnect.

Refer to FIG. 5. A final metalization is performed, using an interconnect metal 40 over a barrier metal 45 which protects contact surface 12 from chemical interaction with interconnect 40. Barrier metal 45 is usually masked by interconnect metal 40 during etch. Comparing contact 10 and contact 11, the original mobility spoiling implant is consumed by silicide 35 in low resistance contact 11 on the left, while the implant remains undisturbed in high resistance contact 10 on the right. The barrier metal is typically W, TiW, or titanium nitride.

CONCLUSION, RAMIFICATIONS AND SCOPE OF INVENTION

From the detailed description and the figures shown here, the invention's advantages should be clear: it accomplishes the differentiation of low resistance contacts from high resistance contacts without requiring the deposition of an added resistive layer, without requiring the use of added circuit surface area, less process integration concerns, than those associated with high-temperature annealing, such as taught in Chen et al. (U.S. Pat. No. 5,665,629). These advantages should be applicable wherever their underlying techniques are within the range of fabrication for both logic and analog applications.

Although the description and illustrative material here contain many specificities, these specificities should not be construed as limiting the scope of the invention but as merely providing illustrations and examples of some of the preferred embodiments of this invention. Thus the scope of the invention should be determined by the appended claims and their legal equivalents, rather than by the examples given above.

What is claimed:

1. A method for forming contact apertures on integrated circuits with different resistances comprising:
    masking a semiconductor substrate with an ion implant mask;
    opening contact regions in the ion implant mask;
    implanting mobility spoiling ions into the exposed contact regions, wherein all the contact regions are exposed;
    covering the substrate with an insulation layer;
    removing portions of the insulating layer to expose some but not all of the contact regions;
    siliciding the exposed contact regions to form low resistance contact regions; and
    removing the insulating layer from the remaining contact regions to form high resistance contacts.

2. The method of claim 1 wherein the semiconductor substrate is silicon.

3. The method of claim 1 wherein the step of siliciding comprises depositing a layer of silicon over the substrate and reacting the silicon layer with a metal selected from the group consisting of platinum, titanium, tungsten and molybdenum.

4. The method of claim 1 further comprising the steps of depositing a barrier metal on the contact region to protect silicide from chemical interaction with the interconnect metalization (aluminum) in the low-resistance contacts.

5. The method of claim 1 wherein the mobility spoiling ions comprises carbon or oxygen.

6. A method for forming high and low resistance contact apertures on integrated circuits comprising:
    masking a semiconductor substrate with an ion implant mask;
    opening contact regions in the ion implant mask;
    implanting mobility spoiling ions into the exposed contact regions;
    covering the substrate with an insulating layer;
    removing portions of the insulating layer to expose some of the contact regions;
    siliciding only the exposed contact regions to form low resistance contact regions;
    removing the insulating layer from the remaining contact regions to form high resistance contacts; and
    depositing a barrier metal on the low resistance contact regions to protect silicides located thereon from chemical interaction with an applied interconnect metalization.

* * * * *